(12) United States Patent
Esashi et al.

(10) Patent No.: US 7,271,946 B2
(45) Date of Patent: Sep. 18, 2007

(54) MICROMIRROR AND MICROMIRROR DEVICE

(75) Inventors: Masayoshi Esashi, Miyagi (JP); Naoki Kikuchi, Tokyo (JP)

(73) Assignees: Tohoku University, Miyagi (JP); PENTAX Corporation, Tokyo (JP)

( * ) Notice: Subject to any disclaimer, the term of this patent is extended or adjusted under 35 U.S.C. 154(b) by 0 days.

(21) Appl. No.: 11/616,433

(22) Filed: Dec. 27, 2006

(65) Prior Publication Data

US 2007/0171501 A1   Jul. 26, 2007

(30) Foreign Application Priority Data

Jan. 6, 2006   (JP) ............................. 2006-001331

(51) Int. Cl.
  *G09G 3/34* (2006.01)
(52) U.S. Cl. ...................... 359/295; 359/224; 359/298; 359/290; 359/291; 345/85; 345/108
(58) Field of Classification Search ................ 359/223, 359/224, 290–292, 295, 298; 345/85, 108
See application file for complete search history.

(56) References Cited

U.S. PATENT DOCUMENTS

| | | | |
|---|---|---|---|
| 5,959,760 A | 9/1999 | Yamada et al. | |
| 6,057,952 A | 5/2000 | Kubo et al. | |
| 6,819,822 B2 | 11/2004 | Behin et al. | |
| 6,995,495 B2 * | 2/2006 | Ko et al. | 359/224 |
| 7,042,621 B2 | 5/2006 | Maeda et al. | |
| 7,088,494 B2 | 8/2006 | Mizuno | |
| 7,116,465 B2 | 10/2006 | Maeda et al. | |
| 7,161,274 B2 * | 1/2007 | Tsuboi et al. | 359/291 |
| 2004/0262507 A1 | 12/2004 | Kikuchi et al. | |
| 2006/0033389 A1 | 2/2006 | Esashi et al. | |

OTHER PUBLICATIONS

U.S. Appl. No. 11/616,328 to Esashi et al., filed on Dec. 27, 2006.

* cited by examiner

*Primary Examiner*—Evelyn A. Lester
(74) *Attorney, Agent, or Firm*—Greenblum & Bernstein, P.L.C.

(57) ABSTRACT

There is provided a micromirror, which is provided with a reflection mirror, a first pair of torsion bars formed to protrude from the reflection mirror, a first supporting frame that supports the reflection mirror such that the reflection mirror is torsionally rotatable about a first rotation axis via the first pair of torsion bars, a second pair of torsion bars formed to protrude from the first supporting frame in a direction substantially perpendicular to a direction in which the first pair of torsion bars are extended, and a second supporting frame that supports the first supporting frame such that the first supporting frame is torsionally rotatable about a second rotation axis substantially perpendicular to the first rotation axis via the second pair of torsion bars. In this configuration, each of the second pair of torsion bars includes two separate conductive members.

6 Claims, 4 Drawing Sheets

MICROMIRROR AND MICROMIRROR DEVICE

BACKGROUND OF THE INVENTION

The present invention relates to a micromirror configured to tilt a mirror in minute quantity by causing electrostatic attraction between adjacent electrodes.

Recently, various types of micro devices are in practical use with development of MEMS (Micro Electro Mechanical Systems) technology. Among such micro devices is a micromirror which can be used, for example, as a scanner adapted for a barcode reader, a laser printer, and etc. Examples of such a micromirror are disclosed in U.S. Pat. No. 6,057,952. The micromirror disclosed in U.S. Pat. No. 6,057,952 is an electrostatic driving type device configured to tilt a mirror in a minute quantity by electrostatic attraction acting between electrodes.

An example of a micromirror disclosed in U.S. Pat. No. 6,057,952 is configured such that a reflection mirror is able to tilt around two rotation axes so that two-dimensional scanning can be performed on a surface of an object. In this example, the reflection mirror is pivotably supported by a first pair of torsion bars. The first pair of torsion bars are supported by a first gimbal part formed around an outer shape of the reflection mirror, and the first gimbal part is pivotably supported by a second pair of torsion bars formed to extend in a direction which perpendicularly intersects with a direction in which the first pair of torsion bars are extended.

The second pair of torsion bars are supported by a second gimbal part formed around an outer shape of the first gimbal part. Two electrodes are formed on the reflection mirror, and two electrodes are also formed on the first gimbal part. Further, an electrode is located oppositely to the above mentioned electrodes.

When a voltage is applied between the electrode on the reflection mirror and the opposed electrode, electrostatic attraction is caused between these electrodes and thereby each of the first pair of torsion bars twists. As a result, the reflection mirror torsionally rotates about a first rotation axis. When a voltage is applied between the electrode on the first gimbal part and the opposed electrode, electrostatic attraction is caused between these electrodes and thereby each of the second pair of torsion bars twists. As a result, the reflection mirror torsionally rotates about a second rotation axis which is perpendicular to the first rotation axis. By thus applying voltages to the electrodes, it is possible to rotate the reflection mirror about two rotation axes.

By directing a beam to be incident on the reflection mirror torsionally rotating about the two rotation axes, the beam reflected by the reflection mirror swings in two dimensions. By directing the reflected beam to illuminate an objection, two-dimensional scanning can be achieved on the object.

In the micromirror disclosed U.S. Pat. No. 6,057,952, patterns are formed on the first and second pairs of torsion bars to electrically connect the electrodes on the reflection mirror to the electrodes on the second gimbal part. Patterns are also formed on the second pair of torsion bars to electrically connect the electrodes on the first gimbal part to the electrodes on the second gimbal part. The term "pattern" means a conductive pattern which is made of a thin leaf of metal (e.g. copper) and is formed on a substrate.

The micromirror is a device having a microstructure. In particular, the torsion bar is formed to have a miniscule width. Further, in general, the width of a pattern is designed considering a manufacturing error. Therefore, the width of a pattern formed on a torsion bar is designed to be narrower than the width of the torsion bar. That is, the width of a pattern on the torsion bar is extremely narrow. Since, in the micromirror in U.S. Pat. No. 6,057,952, it is necessary to form two patterns on each second torsion bar, the width of the pattern on the second torsion bar needs to be narrower than the width of the pattern on the first torsion bar.

Use of a high-precision pattern formation technology makes it possible to form fine patterns on a semiconductor substrate. However, such a high-precision pattern formation technology necessarily increases manufacturing cost of a micromirror. In addition, if a high accuracy is required for forming patterns, tolerance is decreased, which may lead to decrease of a yield of micromirrors. The decrease of a yield of micromirror may also cause decrease of the production efficiency and increase of the cost of production management.

Since a load is put on the torsion bars when the micromirror is in a driven state, if the width of a pattern is extremely narrow, the pattern formed on the torsion bar may exhibit a tendency to be easily broke during the driven state depending on material of which the pattern is made (e.g., brittle material). In other words, in order to narrow the width of a pattern to be formed on a torsion bar, a selectable range of material of the pattern is narrowed.

In addition, if the width of the pattern is narrowed, electrical resistance of the pattern increases. In this case, it is required to increase a driving voltage for driving each electrode.

If a micromirror for one-dimensional scanning is formed to have a base part which includes a torsion bar and is made of conductive material, the base part itself is able to serve as a conductive pattern. That is, in this case, formation of patterns on the micromirror is not required. Therefore, a high-precision pattern formation technology is not required. Use of the conductive base part also resolves the above mentioned problem of rupture of patterns on the torsion bar.

However, in the case of a micromirror for two-dimensional scanning, the number of signal lines to be routed to the outside of the micromirror (i.e., to a driving volage supply unit) is larger than that of the micromiorror for one-dimensional scanning. More specifically, the micromirror for two-dimensional scanning has the number of signal lines to be routed to the outside larger than the number of second pair of torsion bars (i.e., two). It is understood that, in order to configure a micromirror so that a conductive base part thereof serves as conductive patterns, the number of signal lines to be routed to the outside needs to be smaller than or equal to the number of outer torsion bars (i.e., the second pair of torsion bars in the above mentioned example of the micromirror having the two rotation axes). Therefore, it is not possible to use the design scheme of the micromirror for one-dimensional scanning to design a micromirror for two-dimensional scanning.

SUMMARY OF THE INVENTION

The present invention is advantageous in that it provides a micromirror which is capable of scanning about two rotation axes and can be configured without forming patterns on torsion bars.

According to an aspect of the invention, there is provided a micromirror, which is provided with a reflection mirror, a first pair of torsion bars formed to protrude from the reflection mirror, a first supporting frame that supports the reflection mirror such that the reflection mirror is torsionally rotatable about a first rotation axis via the first pair of torsion bars, a second pair of torsion bars formed to protrude from the first supporting frame in a direction substantially perpendicular to a direction in which the first pair of torsion bars are extended, and a second supporting frame that supports the first supporting frame such that the first supporting frame is torsionally rotatable about a second rotation axis substantially perpendicular to the first rotation axis via the second pair of torsion bars. In this configuration, each of the second pair of torsion bars includes two separate conductive members.

According to the configuration of the micromirror, the second pair of torsion bars has four separate conductive members in total. In other word, signal lines larger in number than the second pairs of torsion bars can be routed from internal components to the outside. Such a configuration makes it possible to form a micromirror for two-axis scanning without forming patterns on each of the second pair of torsion bars. Therefore, there is no need to use the high-precision pattern formation technology to form the micromirror. Consequently, a high yield of production on micromirrors can be achieved. Enhancement of the production efficiency and cost reduction of production management can also be achieved.

In at least one aspect, the micromirror further includes a first pair of electrodes respectively formed on the reflection surface and the first supporting frame so that the reflection mirror torsionally rotates about the first rotation axis in a direction of normal rotation when electronic attraction acts between the first pair of electrodes, a second pair of electrodes respectively formed on the reflection surface and the first supporting frame so that the reflection mirror torsionally rotates about the first rotation axis in a direction of inverse rotation when electronic attraction acts between the second pair of electrodes, a third pair of electrodes respectively formed on the first supporting frame and the second supporting frame so that the reflection mirror torsionally rotates about the second rotation axis in a direction of normal rotation when electronic attraction acts between the third pair of electrodes, and a fourth pair of electrodes respectively formed on the first supporting frame and the second supporting frame so that the reflection mirror torsionally rotates about the second rotation axis in a direction of inverse rotation when electronic attraction acts between the fourth pair of electrodes.

In at least one aspect, each of the second pair of torsion bars includes a laminated structure of three layers including two conductive layers and an insulating layer sandwiched between the two conductive layers. In this case, the two conductive layers of each of the second pair of torsion bars respectively function as the two separate conductive members.

According to another aspect of the invention, there is provided a micromirror device, which includes the above mentioned micromirror, and a driving voltage supply unit that supplies a voltage to the micromirror. The micromirror includes a first pair of electrodes respectively formed on the reflection surface and the first supporting frame so that the reflection mirror torsionally rotates about the first rotation axis in a direction of normal rotation when electronic attraction acts between the first pair of electrodes, and a second pair of electrodes respectively formed on the reflection surface and the first supporting frame so that the reflection mirror torsionally rotates about the first rotation axis in a direction of inverse rotation when electronic attraction acts between the second pair of electrodes. In this configuration, the driving voltage supply unit is connected to the first pair of electrodes via two of the separate conductive members of the second pair of torsion bars so that a voltage is applied between the first pair of electrodes. The driving voltage supply unit is connected to the second pair of electrodes via two of the separate conductive members of the second pair of torsion bars so that a voltage is applied between the second pair of electrodes.

In at least one aspect, each of the second pair of torsion bars includes a laminated structure of three layers including two conductive layers and an insulating layer sandwiched between the two conductive layers. The two conductive layers of each of the second pair of torsion bars respectively function as the two separate conductive members.

According to another aspect of the invention, there is provided a micromirror, which includes a reflection mirror, a movable electrode group including electrodes formed to protrude from the reflection mirror, a first pair of torsion bars formed to protrude from the reflection mirror in a direction which is different from a direction in which the movable electrode group is formed, a first supporting frame that supports the reflection mirror such that the reflection mirror is torsionally rotatable about a first rotation axis via the first pair of torsion bars, a fixed electrode group including electrodes which are formed to protrude from the first supporting frame and are positioned adjacently to the movable electrode group, a second pair of torsion bars formed to protrude from the first supporting frame in a direction substantially perpendicular to a direction in which the first pair of torsion bars are extended, and a second supporting frame that supports the first supporting frame such that the first supporting frame is torsionally rotatable about a second rotation axis substantially perpendicular to the first rotation axis via the second pair of torsion bars. Each of the second pair of torsion bars includes two separate conductive members. The movable electrode group and the fixed electrode group are electrically connectable to an external device via two of the separate conductive members of the second pair of torsion bars so that the mirror tilts in a direction of normal rotation when a voltage is applied by the external device between the movable electrode group and the fixed electrode group. The movable electrode group and the fixed electrode group are electrically connectable to the external device via the other two of the separate conductive members of the second pair of torsion bars so that the mirror tilts in a direction of inverse rotation when a voltage is applied by the external device between the movable electrode group and the fixed electrode group.

According to the configuration of the micromirror, the second pair of torsion bars has four separate conductive members in total. In other word, signal lines larger in number than the second pairs of torsion bars can be routed from internal components to the outside. Such a configuration makes it possible to form a micromirror for two-axis scanning without forming patterns on each of the second pair of torsion bars. Therefore, there is no need to use the high-precision pattern formation technology to form the micromirror. Consequently, a high yield of production on micromirrors can be achieved. Enhancement of the production efficiency and cost reduction of production management can also be achieved.

BRIEF DESCRIPTION OF THE ACCOMPANYING DRAWINGS

DETAILED DESCRIPTION OF THE EMBODIMENTS

Hereinafter, an embodiment according to the invention is described with reference to the accompanying drawings.

Figure 1:
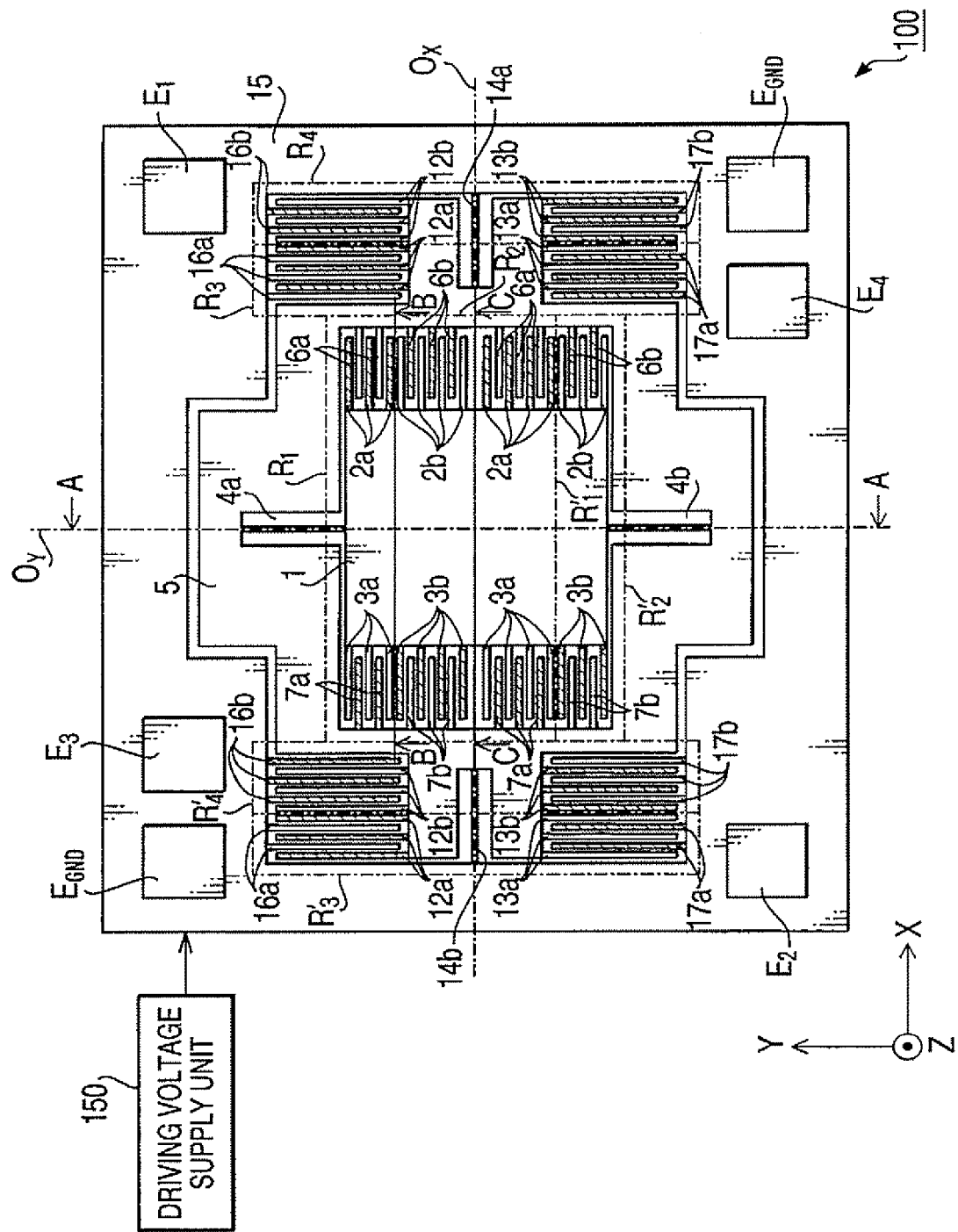
FIG. 1 is a top view of a micromirror according to an embodiment of the invention.
Figure 2A:
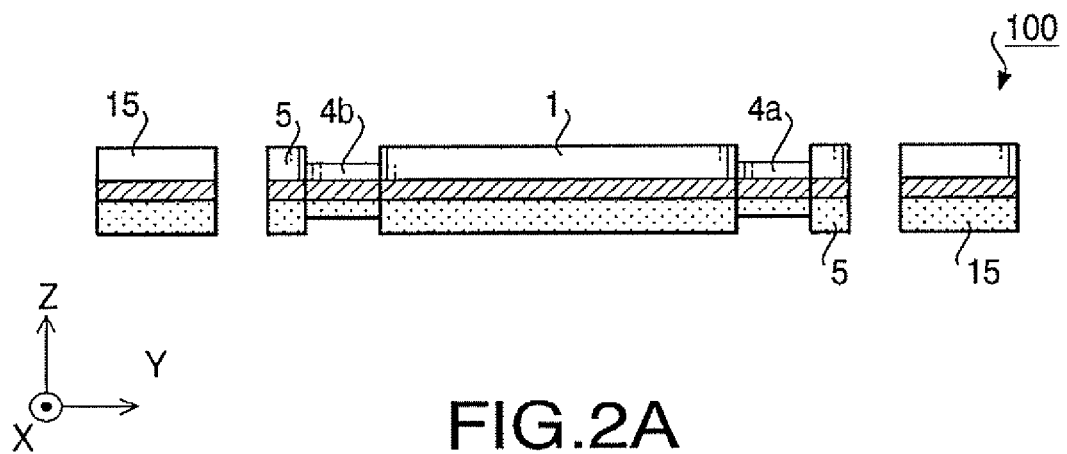
FIG. 2A is a cross section of the micromirror along a line A-A in FIG. 1.
Figure 2B:
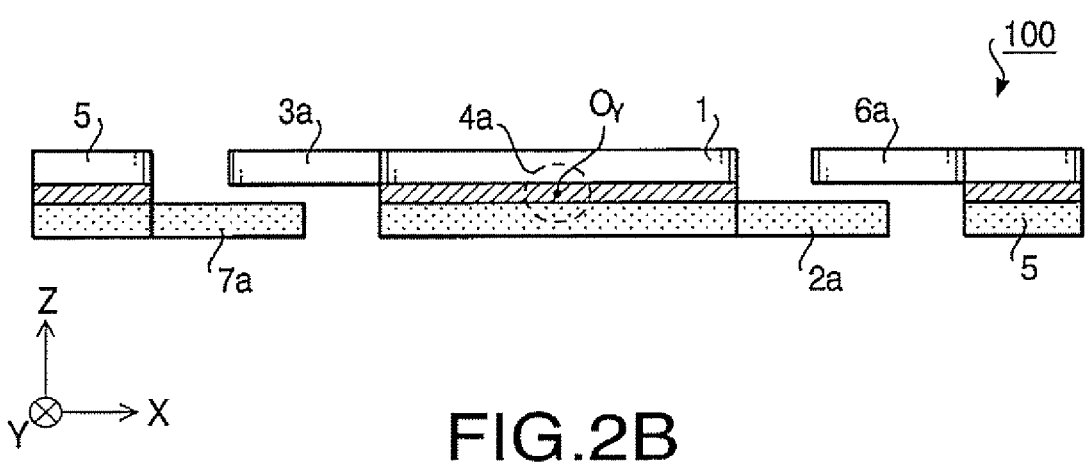
FIG. 2B is a cross section of the micromirror along a line B-B in FIG. 1.
Figure 2C:
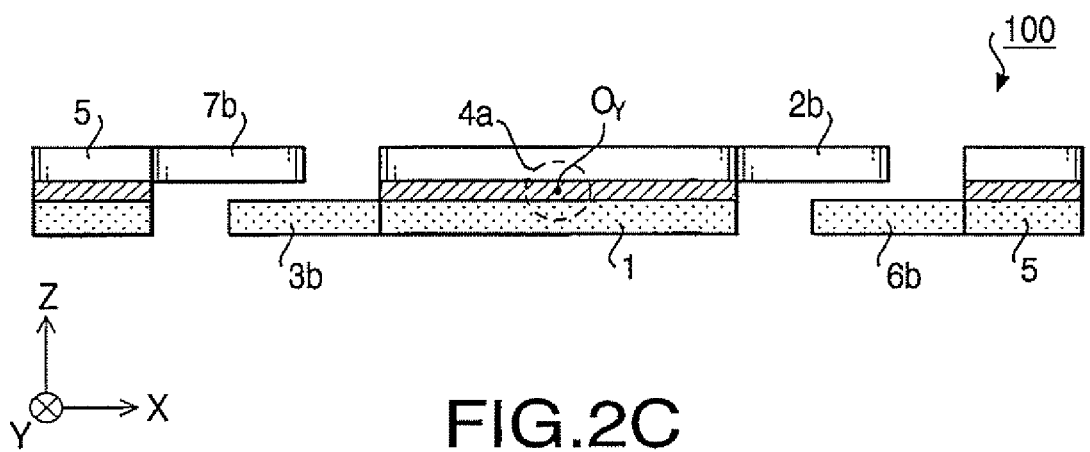
FIG. 2C is a cross section of the micromirror along a line C-C in FIG. 1.

FIG. 1 is a top view of a micromirror 100 according to an embodiment of the invention. FIG. 2A is a cross section of the micromirror 100 along a line A-A in FIG. 1. FIG. 2B is a cross section of the micromirror 100 along a line B-B in FIG. 1. FIG. 2C is a cross section of the micromirror 100 along a line C-C in FIG. 1. The micromirror 100 can be used in various types of devices such as a barcode reader and a laser printer. The micromirror 100 is mounted on a supporting substrate when employed in these various types of devices. In each of FIGS. 1 and 2A to 2C, Cartesian coordinates are defined for the purpose of explanations.

The micromirror 100 includes a mirror 1, a plurality of movable comb-shaped teeth 2a, 2b, 3a, 3b, 12a, 12b, 13a and 13b, torsion bars 4a, 4b, 14a, and 14b, gimbal parts 5 and 15, and fixed comb-shaped teeth 6a, 6b, 7a, 7b, 16a, 16b, 17a and 17b. Although in FIG. 1 parts of the movable comb-shaped teeth and the fixed comb-shaped teeth are indicated by oblique lines for the purpose of explanations of the micromirror 100, these oblique lines are not used to define properties (e.g., sizes, shapes or colors) of these parts.

These structural components of the micromirror 100 are formed of a single silicon substrate having a three layer structure using a semiconductor manufacturing process. FIG. 2A schematically shows a three layer structure of the structural components in the micromirror 100. The structural components are integrated into a single-piece structure. More specifically, the three layer structure is a laminated structure of a conductive layer, an insulating layer and a conductive layer. Each layer is formed of material selected from a wide range of material. For example, the conductive layer is made of conductive silicon, and the insulating layer is made of $SiO_2$. Hereafter, the conductive layer located on the upper side is referred to as a "top face conductive layer", and the conductive layer located on the lower side is referred to as a "bottom face conductive layer".

A metal film is evaporated on a top surface of the mirror 1. The top surface on which the metal film is evaporated corresponds to a surface in an X-Y plane, and is frequently referred to as a reflection surface hereafter. In a state where the micromirror 100 is mounted on one of the above mentioned various types of devices, a beam for scanning on an object is incident on the reflection surface of the mirror 1. The beam incident on the reflection surface is reflected from the reflection surface in a predetermined direction without being substantially attenuated. The predetermined direction (i.e., a direction in which the reflected beam proceeds) changes depending on a tilting angle of the mirror 1.

It should be noted that although in FIG. 1 the mirror 1 is illustrated to have a rectangular shape, the mirror 1 may be formed to have a different shape (e.g., a circular shape or an elliptical shape).

The plurality of movable comb-shaped teeth 2a, 2b, 3a and 3b are formed to protrude outwardly from each side of the mirror 1 extending along a Y-axis direction. The movable comb-shaped teeth 2a and 3a are located oppositely to each other with respect to a rotation axis $O_Y$ of the mirror 1. The movable comb-shaped teeth 2b and 3b are also located oppositely to each other with respect to the rotation axis $O_Y$ of the mirror 1. The rotation axis $O_Y$ passes through a center of the mirror 1, and is parallel with sides of the mirror 1 along the Y-axis and perpendicular to the other sides of the mirror 1 along the X-axis.

The movable comb-shaped teeth are arranged at constant pitches, and have the same shape and size. By this structure, it is possible to make a tilting property of the mirror 1 during normal rotation and a tilting property of the mirror 1 during inverse rotation substantially equal to each other. The word tilting property means a property representing a relationship between a tilting angle of the mirror 1 and a voltage applied to the micromirror 100. The tilting property may be represented, for example, by an equation or a graph. If the tilting properties of the mirror 1 in normal rotation and inverse rotation are equal to each other, tilting movement of the mirror 1 during the normal rotation becomes symmetrical with tilting movement of the mirror 1 during the inverse rotation with respect to a position of the mirror 1 (shown in FIG. 1) defined when no voltage is applied to the mirror 1, assuming that a voltage having constant frequency and amplitude is applied to the mirror 1 both in the normal rotation and in the inverse rotation.

If symmetry between tilting movement of the mirror 1 in the normal rotation and tilting movement of the mirror 1 in the inverse rotation is not required, the movable comb-shaped teeth may have non-identical pitches and non-identical shapes and sizes.

The torsion bars 4a and 4b are elongated in the Y-axis direction, and are formed to protrude from opposed sides of the mirror 1 extending along the X-axis. Each of the torsion bars 4a and 4b has a form of a round bar having a center axis coinciding with the rotation axis $O_Y$, and has a property of being twisted relatively easily by an external force When the torsion bars 4a and 4b are twisted, the mirror 1 tilts in an X-Z plane. The tilting angle of the mirror 1 varies depending on a twisted amount of each torsion bar (or the strength of an external force acting on the torsion bars 4a and 4b). Ends of the torsion bars 4a and 4b are connected to the gimbal part 5 so that the torsion bars 4a and 4b are formed integrally with the gimbal part 5.

The gimbal part 5 is formed to surround the entire region of the side surface of the mirror 1. The mirror 1 and the movable comb-shaped teeth 2a, 2b, 3a and 3b are supported by the torsion bars 4a and 4b to be torsionally rotatable with respect to the gimbal part 5.

The fixed comb-shaped teeth 6a and 6b are formed to protrude inwardly from the sides of the gimbal part 5 along the Y-axis, and to have the same pitches as those of neighboring movable comb-shaped teeth (2a and 2b). Similarly to the fixed comb-shaped teeth 6a and 6b, the fixed comb-shaped teeth 7a and 7b are formed to protrude inwardly from the sides of the gimbal part 5 along the Y-axis. The fixed comb-shaped teeth 7a and 7b are arranged oppositely to the fixed comb-shaped teeth 6a and 6b, respectively, with respect to the rotation axis $O_Y$, and are located adjacently to the movable comb-shaped teeth 3a and 3b, respectively.

The fixed comb-shaped teeth 6a, 6b, 7a and 7b have the same shape and size. When viewed as a top view, the fixed comb-shaped teeth (6a, 6b, 7a and 7b) are arranged such that a movable comb-shaped tooth gets caught between neighboring ones of the fixed comb-shaped teeth (or a fixed comb-shaped tooth gets caught between neighboring ones of the movable comb-shaped teeth). Therefore, gaps formed between fixed comb-shaped teeth and respective neighboring movable comb-shaped teeth are equal to each other. Overlapping areas respectively formed by the fixed comb-shaped teeth and neighboring movable comb-shaped teeth (i.e., formed by opposed surfaces of the fixed comb-shaped teeth and respective neighboring movable comb-shaped teeth) defined in a side cross-section view when the mirror 1 is tilted become substantially equal to each other.

As described above, the fixed comb-shaped teeth 2a, 2b, 3a and 3b are formed to protrude from the mirror 1, and the movable comb-shaped teeth 6a, 6b, 7a and 7b are formed to protrude from the gimbal part 5. Therefore, when the mirror 1 tilts with respect to the gimbal part 5, each of the movable comb-shaped teeth moves with respect to each of the fixed comb-shaped teeth.

The movable comb-shaped teeth 12a, 12b, 13a and 13b are formed to protrude outwardly from sides of the gimbal part 5 extending along the X-axis direction. The movable comb-shaped teeth 12a and 13a are located oppositely to each other with respect to a rotation axis $O_X$ of the mirror 1. The movable comb-shaped teeth 12b and 13b are also located oppositely to each other with respect to the rotation axis $O_X$ of the mirror 1. The rotation axis $O_X$ passes through the center of the mirror 1, and perpendicularly intersects with the rotation axis $O_Y$. Similarly to the above configuration of the movable comb-shaped teeth (2a, 2b, 3a and 3b), pitches, shapes and sizes of the movable comb-shaped teeth 12a, 12b, 13a and 13b are defined to achieve the above mentioned symmetric property of tilting movement of the mirror 1.

The torsion bars 14a and 14b are elongated in the X-axis direction, and are formed to protrude from opposed sides of the mirror 1 extending along the Y-axis. Each of the torsion bars 14a and 14b has a form of a round bar having a center axis coinciding with the rotation axis $O_X$. The torsion bars 14a and 14b have the same property as that of the torsion bars 4a and 4b. Therefore, the torsion bars 14 and 14b are twisted relatively easily by an external force. When the torsion bars 14a and 14b are twisted, the mirror 1 tilts in a Y-Z plane. Ends of the torsion bars 14a and 14b are connected to the gimbal part 15 so that the torsion bars 14a and 14b are formed integrally with the gimbal part 15.

The gimbal part 15 is formed to surround the entire region of the side surface of the gimbal part 15, and is supported by the supporting substrate. The gimbal part 15 is fixed, for example, to a housing of a device on which the micromirror 100 is mounted. By virtue of the torsion bars 14 and 14b, structural component surrounded by the gimbal part 15 are able to torsionally rotate with respect to the gimbal part 15.

The fixed comb-shaped teeth 16a and 16b are formed to protrude inwardly from the sides of the gimbal part 15 along the X-axis, and to have the same pitches as those of neighboring movable comb-shaped teeth (12a and 12b). Similarly to the fixed comb-shaped teeth 16a and 16b, the fixed comb-shaped teeth 17a and 17b are formed to protrude inwardly from the sides of the gimbal part 15 along the X-axis. The fixed comb-shaped teeth 17a and 17b are arranged oppositely to the fixed comb-shaped teeth 16a and 16b, respectively, with respect to the rotation axis $O_X$, and are located adjacently to the movable comb-shaped teeth 13a and 13b, respectively.

The fixed comb-shaped teeth 16a, 16b, 17a and 17b have the same shape and size. When viewed as a top view, the fixed comb-shaped teeth (16a, 16b, 17a and 17b) are arranged such that a movable comb-shaped tooth is get caught between neighboring ones of the fixed comb-shaped teeth (or a fixed comb-shaped tooth is get caught between neighboring ones of the movable comb-shaped teeth). Therefore, gaps formed between fixed comb-shaped teeth and respective neighboring movable comb-shaped teeth are equal to each other. Overlapping areas respectively formed by the fixed comb-shaped teeth and neighboring movable comb-shaped teeth (i.e., formed by opposed surfaces of the fixed comb-shaped teeth and respective neighboring movable comb-shaped teeth) defined in a side cross-sectional view when the mirror 1 is tilted become substantially equal to each other.

Similarly to the above configuration of the movable comb-shaped teeth, pitches, shapes and sizes of the fixed comb-shaped teeth 6a, 6b, 7a, 7b, 16a, 16b, 17a and 17b are defined to achieve the above mentioned symmetric property of tilting movement of the mirror 1. If a symmetric property of movement of the mirror 1 is not required, these fixed comb-shaped teeth may have non-identical structural parameters (e.g., pitches, shapes and sizes).

As shown in FIG. 1, the micromirror 100 includes electrode pads $E_{GND}$, $E_1$, $E_2$, $E_3$ and $E_4$ formed, for example, of metal films evaporated onto a top surface of the gimbal part 15. These electrode pads are electrically connected to corresponding ones of the fixed and movable comb-shaped teeth, and are also connected to a driving voltage supply unit 150. Each of the fixed and movable comb-shaped teeth is connected to the driving voltage supply unit 150.

Figure 3B:
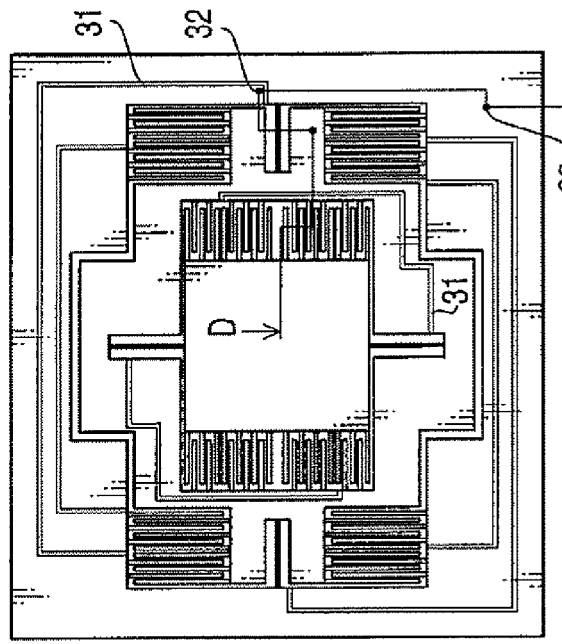
FIG. 3B shows a bottom face conductive layer of the micromirror.
Figure 3A:
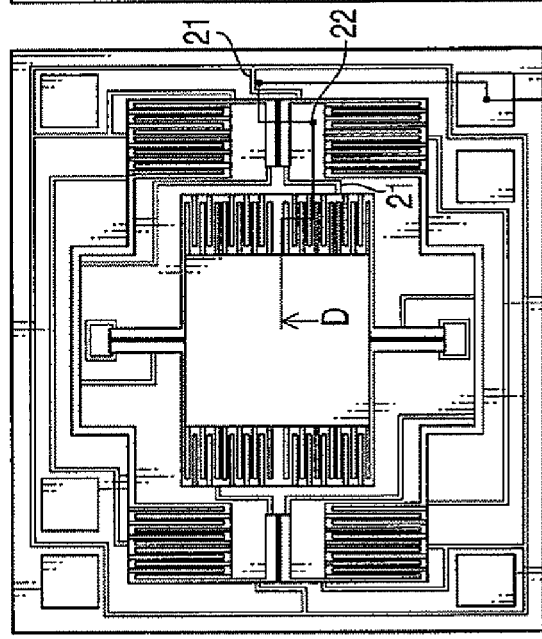
FIG. 3A shows a top face conductive layer of the micromirror.
Figure 3C:
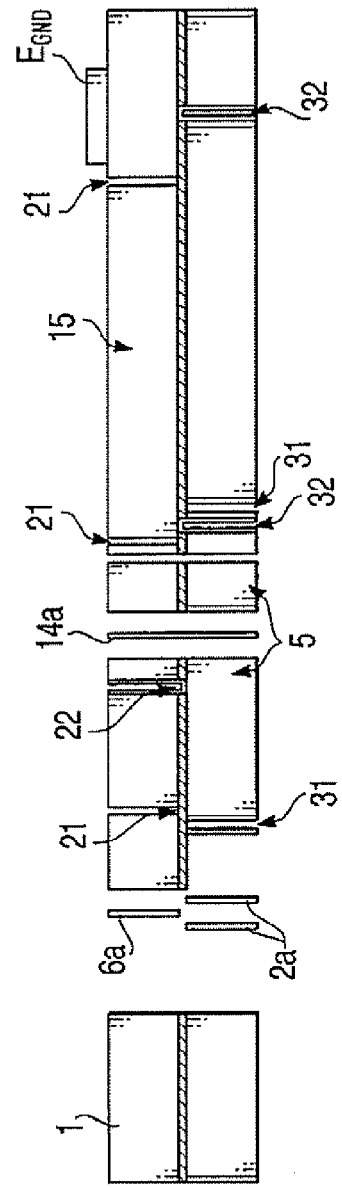
FIG. 3C shows a cross section of the micromirror along a line D-D in FIGS. 3A and 3B.

FIG. 3A shows a plan view of the top face conductive layer of the micromirror 100, FIG. 3B shows a plan view of the bottom face conductive layer of the micromirror 100, and FIG. 3C shows a cross section of the micromirror 100 along a line D-D in FIGS. 3A and 3B.

As shown in FIGS. 3A and 3C, an insulating groove 21 is formed in the top face conductive layer to divide the top face conductive layer into a plurality of regions insulated by the insulating groove 21 from each other. As shown in FIGS. 3B and 3C, an insulating groove 31 is formed in the bottom face conductive layer to divide the bottom face conductive layer into a plurality of regions insulated by the insulating groove 31 from each other. The insulating grooves 21 and 31 may be formed by a semiconductor manufacturing process such as dry etching. As shown in FIGS. 3A to 3C, the top conductive layer laminated on the insulating layer is in a state where the top face conductive layer is divided into the plurality of regions physically separated from each other by the groove 21, and the bottom conductive layer laminated on the insulating layer is in a state where the bottom conductive layer is divided into the plurality of regions physically separated from each other by the groove 31.

As shown in FIGS. 3A to 3C, a conducting groove 22 for electrically connecting a region in the top face conductive layer to a region in the bottom face conductive layer is formed in the top face conductive layer, and conducting grooves 32 for electrically connecting a region in the bottom face conductive layer to a region in the top face conductive layer are formed in the bottom face conductive layer. These conducting grooves 22 and 32 may be formed, for example, by evaporating a metal film onto an inner surface of a groove formed by dry etching. That is, parts of the regions of the top face conductive layer are electrically connected to the corresponding regions of the bottom face conductive layer through the conducting groove 22 or 32, while the other parts of the regions in the top face conductive layer are insulated by the insulating layer from the bottom face conductive layer.

By the above mentioned structure shown in FIGS. 3A to 3C, the movable and fixed comb-shaped teeth are connected to the electrode pads in one-to-one relation so that the movable and fixed comb-shaped teeth are kept at predetermined voltages, respectively. More specifically, the movable comb-shaped teeth 2a, 2b, 3a, 3b, 12a, 12b, 13a and 13b are connected to the electrode pad $E_{GND}$, the fixed comb-shaped teeth 6a and 7a are connected to the electrode pad $E_1$, the fixed comb-shaped teeth 6b and 7b are connected to the electrode pad $E_2$, the fixed comb-shaped teeth 16a and 17a are connected to the electrode pad $E_3$, and the fixed comb-shaped teeth 16b and 17b are connected to the electrode pad $E_4$.

That is, in the micromirror 100, one of the fixed comb-shaped teeth and the movable comb-shaped teeth located oppositely to each other is connected to the electrode pad $E_{GND}$. By this structure, the number of signal lines to be routed from the internal components to the gimbal part 15 (or the driving voltage supply source) via the torsion bars 14a and 14b are decreased to a minimum number. In this embodiment, the number of signal lines to be routed from the internal components to the gimbal part 15 via the torsion bars 14a and 14b are decreased to three signal lines (i.e., a signal line from the electrode pad $E_{GND}$ to the movable comb-shaped teeth, and high frequency signal lines between the electrode pad $E_1$ and the corresponding fixed comb-shaped teeth and between the electrode $E_2$ and the corresponding fixed comb-shaped teeth.

The above mentioned laminated structure in which the insulating layer is sandwiched between the two conductive layers enables the three signal lines to be routed from the internal structure to the gimbal part 15 via the torsion bars 14 and 14b. Specifically, by forming each of the torsion bars 14a and 14b to have two conductive layers insulated from each other by the insulating layer, it is possible to route two signal lines via a single torsion bar. According to the embodiment, even if the number of signal lines (three signal lines in this embodiment) to be routed from the inside structure to the gimbal part 15 is larger than the number of torsion bars (14a and 14b), all of the signal lines can be routed to the gimbal part 15. In this embodiment, by using the top face conductive layer and the bottom face conductive layer of each of the torsion bars 14a and 14b, four signal lines can be routed from the internal components to the gimbal part 15 via the torsion bars 14a and 14b.

According to the above mentioned laminated structure of the micromirror 100, the number of signal lines corresponding to the double of the number of outermost torsion bars (torsion bars 14a and 14b in this embodiment) can be routed from the internal components to the driving voltage supply unit 150 via the outermost torsion bars. In other words, a micromirror adapted for scanning about multiple axes can be attained without forming any pattern in a torsion bar. Accordingly, a high-precision pattern formation technology is not required. Consequently, a high yield of production of micromirrors can be achieved. Enhancement of the production efficiency and cost reduction of production management can also be achieved.

Since the base part of the micromirror 100 also serves to supply driving voltages from the driving voltage supply unit to the internal components of the micromirror 100, it is also possible to secure the large width and area of each signal line. It should be noted that each of the top face conductive layer, the bottom face conductive layer and the conducting grooves 22 and 23 serves as a signal line. Specifically, there is no need to form a pattern on each torsion bar because the torsion bar itself having the width and a cross section larger than those of the pattern serves as a signal line. In other words, the configuration of the micromirror 100 according to the embodiment eliminates the need to form an electronic member (i.e., a pattern) having low strength on a deformable part (i.e., a torsion bar). Therefore, durability of the micromirror 100 can be enhanced. Since the size of the cross section of the signal channel is increased, low power consumption can also be achieved.

Hereafter, a positional relationship between the movable comb-shaped teeth and the fixed comb-shaped teeth is described. Only for the purpose for explaining the relationship, the micromirror 100 is divided into regions $R_1$, $R_2$, $R_3$, $R_4$, $R'_1$, $R'_2$, $R'_3$ and $R'_4$ (see FIG. 1). In the regions $R_1$ and $R'_1$, the movable comb-shaped teeth 2a and the fixed comb-shaped teeth 6a are located adjacently to each other, and the movable comb-shaped teeth 3a and the fixed comb-shaped teeth 7a are located adjacently to each other.

As shown in FIG. 2B, each of the movable comb-shaped teeth 2a and the fixed comb-shaped teeth 7a are formed of the bottom face conductive layer, while each of the movable comb-shaped teeth 3a and the fixed comb-shaped teeth 6a are formed of the top face conductive layer. Therefore, in FIG. 2B, the movable comb-shaped teeth are located on the lower side of the fixed comb-shaped teeth at one end of the mirror 1, while the movable comb-shaped teeth are located on the upper side of the fixed comb-shaped teeth at the other end of the mirror 1. That is, the movable comb-shaped teeth 2a are located on the lower side of the fixed comb-shaped teeth 6a, while the movable comb-shaped teeth 3a are located on the upper side of the fixed comb-shaped teeth 7a.

In the regions $R_2$ and $R'_2$, the movable comb-shaped teeth 2b and the fixed comb-shaped teeth 6b are located adjacently to each other, and the movable comb-shaped teeth 3b and the fixed comb-shaped teeth 7b are located adjacently to each other. As shown in FIG. 5C, each of the movable comb-shaped teeth 2b and the fixed comb-shaped teeth 7b is formed of the top face conductive layer, while each the movable comb-shaped teeth 3b and the fixed comb-shaped teeth 6b is formed of the bottom face conductive layer. Therefore, in FIG. 2C, the movable comb-shaped teeth are located on the upper side of the fixed comb-shaped teeth at one end of the mirror 1, while the movable comb-shaped teeth are located on the lower side of the fixed comb-shaped teeth at the other end of the mirror 1. That is, the movable comb-shaped teeth 2b are located on the upper side of the fixed comb-shaped teeth 6b, while the movable comb-shaped teeth 3b are located on the lower side of the fixed comb-shaped teeth 7b.

In the regions $R_3$ and $R'_3$, the movable comb-shaped teeth 12a and the fixed comb-shaped teeth 16a are located adjacently to each other, and the movable comb-shaped teeth 13a and the fixed comb-shaped teeth 17a are located adjacently to each other. Each of the movable comb-shaped teeth 12a and the fixed comb-shaped teeth 17a is formed of the bottom face conductive layer, while each the movable comb-shaped teeth 13a and the fixed comb-shaped teeth 16a is formed of the top face conductive layer. Therefore, in each of the regions $R_3$ and $R'_3$, the movable comb-shaped teeth are located on the lower side of the fixed comb-shaped teeth at one end of the mirror 1, while the movable comb-shaped teeth are located on the upper side of the fixed comb-shaped teeth at the other end of the mirror 1. That is, the movable comb-shaped teeth 12a are located on the lower side of the fixed comb-shaped teeth 16a, while the movable comb-shaped teeth 13a are located on the upper side of the fixed comb-shaped teeth 17a.

In the regions R4 and R'4, the movable comb-shaped teeth 1b and the fixed comb-shaped teeth 16b are located adjacently to each other, and the movable comb-shaped teeth 13b and the fixed comb-shaped teeth 17b are located adjacently to each other. Each of the movable comb-shaped teeth 12b and the fixed comb-shaped teeth 17b is formed of the bottom face conductive layer, while each the movable comb-shaped teeth 13b and the fixed comb-shaped teeth 16b is formed of the top face conductive layer. Therefore, in each of the regions R4 and R'4, the movable comb-shaped teeth are located on the lower side of the fixed comb-shaped teeth at one end of the mirror 1, while the movable comb-shaped teeth are located on the upper side of the fixed comb-shaped teeth at the other end of the mirror 1. That is, the movable comb-shaped teeth 12b are located on the lower side of the fixed comb-shaped teeth 16b, while the movable comb-shaped teeth 13b are located on the upper side of the fixed comb-shaped teeth 17b.

As described above, in the micromirror 100, the movable comb-shaped teeth 2b, 3a, 12b and 13a and the fixed comb-shaped teeth 6a, 7b, 16a and 17b (all of which are not provided with oblique lines) are in the same level. Further, the movable comb-shaped teeth 2a, 3b, 12a and 13b and the fixed comb-shaped teeth 6b, 7a, 16b and 17a (all of which are provided with oblique lines) are in the same level. By the structure, the mirror 1, the gimbal parts 5 and 15 can be positioned in the same level, and therefore the thickness of the micromirror 100 can be reduced.

The mirror 1 and the gimbal parts are formed of a silicon substrate having a constant thickness. Therefore, by forming the movable and fixed comb-shaped teeth as described above, it is possible to make the thickness of the whole micromirror 100 and the thickness of the mirror 1 substantially equal to each other.

Figure 4A:
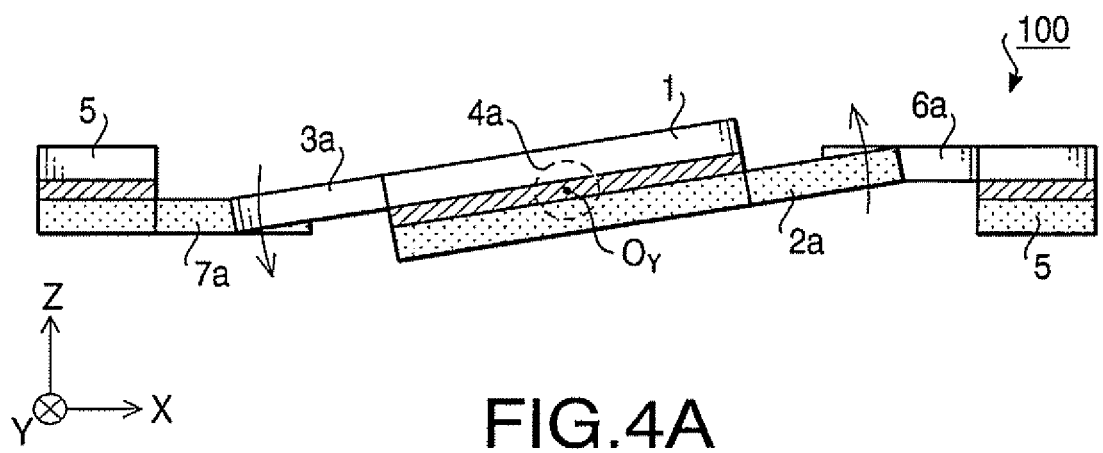
FIG. 4A is a cross section of the micromirror along the line B-B illustrating a state where a mirror is tilted in a direction of inverse rotation about a rotation axis $O_Y$.
Figure 4B:
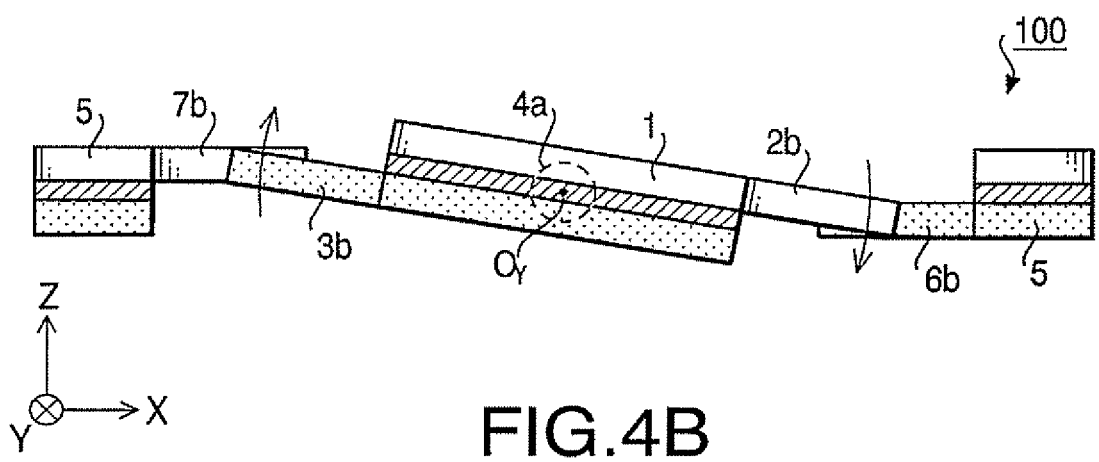
FIG. 4B is a cross section of the micromirror along the line C-C illustrating a state where the mirror is tilted in a direction of normal rotation about the rotation axis $O_X$.

Operations of the micromirror 100 will now be described. FIG. 4A is a cross section of the micromirror 100 along the line B-B illustrating a state where the mirror 1 is tilted in the direction of inverse rotation about the rotation axis $O_Y$. FIG. 4B is a cross section of the micromirror 100 along the line C-C illustrating a state where the mirror 1 is tilted in the direction of normal rotation about the rotation axis $O_X$. The micromirror 100 is electrically connected to the driving voltage supply unit 150 to form a circuit together with the driving voltage supply unit 150.

In order to tilt the mirror 1 in the direction of inverse rotation about the rotation axis $O_Y$ as shown in FIG. 4A, a predetermined voltage is applied by the driving voltage supply unit 150 between the movable comb-shaped teeth 2a and the fixed comb-shaped teeth 6a, and the same voltage is also applied by the driving voltage supply unit 150 between the movable comb-shaped teeth 3a and the fixed comb-shaped teeth 7a. The movable comb-shaped teeth 2a and 3a are connected to the electrode pad $E_{GND}$ to be kept at a ground level, while the fixed comb-shaped teeth 6a and 7a are connected to the electrode pad $E_1$ to be kept at a voltage $V_1$.

As a result, electrostatic attraction acts between the movable comb-shaped teeth 2a and the fixed comb-shaped teeth 6a, and electrostatic attraction also acts between the movable comb-shaped teeth 3a and the fixed comb-shaped teeth 7a. By the electrostatic attraction, the movable comb-shaped teeth 2a are drawn upwardly toward the fixed comb-shaped teeth 6a, and the movable comb-shaped teeth 3a are drawn downwardly toward the fixed comb-shaped teeth 7a. That is, a force moving upwardly the mirror 1 acts on the mirror 1 on the movable comb-shaped teeth 2a side, while a force moving downwardly the mirror 1 acts on the mirror 1 on the movable comb-shaped teeth 3a side.

As described above, the mirror 1 is pivotally supported by the torsion bars 4a and 4b. Therefore, when the mirror 1 is tilted by the electrostatic attraction, the torsion bars 4a and 4b are in twisted states. By the twisting of the torsion bars 4a and 4b, the tilting movement of the mirror 1 results in rotation movement of the mirror 1. That is, the mirror 1 tilts in the direction of inverse rotation about the rotation axis $O_Y$ in the X-Z plane.

In order to tilt the mirror 1 in the direction of normal rotation about the rotation axis $O_Y$ as shown in FIG. 4B, a predetermined voltage is applied by the driving voltage supply unit 150 between the movable comb-shaped teeth 2b and the fixed comb-shaped teeth 6b, and the same voltage is also applied by the driving voltage supply unit 150 between the movable comb-shaped teeth 3b and the fixed comb-shaped teeth 7b. The movable comb-shaped teeth 2b and 3b are connected the electrode pad $E_{GND}$ to be kept at a ground level, while the fixed comb-shaped teeth 6b and 7b are connected to the electrode pad $E_2$ to be kept at a voltage $V_2$.

As a result, electrostatic attraction acts between the movable comb-shaped teeth 2b and the fixed comb-shaped teeth 6b, and electrostatic attraction also acts between the movable comb-shaped teeth 3b and the fixed comb-shaped teeth 7b. By the electrostatic attraction, the movable comb-shaped teeth 2b are drawn downwardly toward the fixed comb-shaped teeth 6b, and the movable comb-shaped teeth 3b are drawn upwardly toward the fixed comb-shaped teeth 7b. That is, a force moving downwardly the mirror 1 acts on the mirror 1 on the movable comb-shaped teeth 2b side, while a force moving upwardly the mirror 1 acts on the mirror 1 on the movable comb-shaped teeth 3b side.

Since the mirror 1 is pivotally supported by the torsion bars 4a and 4b, the tilting movement of the mirror 1 caused by the electronic attraction results in rotation movement of the mirror 1. That is, the mirror 1 tilts in the direction of normal rotation about the rotation axis $O_Y$ in the X-Z plane.

In order to tilt the mirror 1 in the direction of normal rotation about the rotation axis $O_X$, a predetermined voltage is applied by the driving voltage supply unit 150 between the movable comb-shaped teeth 12a and the fixed comb-shaped teeth 16a, and the same voltage is also applied by the driving voltage supply unit 150 between the movable comb-shaped teeth 13a and the fixed comb-shaped teeth 17a. The movable comb-shaped teeth 12a and 13a are connected the electrode pad $E_{GND}$ to be kept at a ground level, while the fixed comb-shaped teeth 16a and 17a are connected to the electrode pad $E_3$ to be kept at a voltage $V_3$.

As a result, electrostatic attraction acts between the movable comb-shaped teeth 12a and the fixed comb-shaped teeth 16a, and electrostatic attraction also acts between the movable comb-shaped teeth 13a and the fixed comb-shaped teeth 17a. By the electrostatic attraction, the movable comb-shaped teeth 12a are drawn upwardly toward the fixed comb-shaped teeth 16a, and the movable comb-shaped teeth 13a are drawn downwardly toward the fixed comb-shaped teeth 17a. That is, a force moving upwardly the mirror 1 acts on the mirror 1 on the movable comb-shaped teeth 12a side, while a force moving downwardly the mirror 1 acts on the mirror 1 on the movable comb-shaped teeth 13a side.

Since the gimbal part 5 (i.e., the mirror 1) is pivotally supported by the torsion bars 14a and 14b, the tilting movement of the mirror 1 caused by the electronic attraction results in rotation movement of the mirror 1. That is, the mirror 1 tilts in the direction of normal rotation about the rotation axis $O_X$ in the Y-Z plane.

In order to tilt the mirror 1 in the direction of inverse rotation about the rotation axis $O_X$, a predetermined voltage is applied by the driving voltage supply unit 150 between the movable comb-shaped teeth 12b and the fixed comb-shaped teeth 16b, and the same voltage is also applied by the driving voltage supply unit 150 between the movable comb-shaped teeth 13b and the fixed comb-shaped teeth 17b. The movable comb-shaped teeth 12b and 13b are connected the electrode pad $E_{GND}$ to be kept at a ground level, while the fixed comb-shaped teeth 16b and 17b are connected to the electrode pad $E_4$ to be kept at a voltage $V_4$.

As a result, electrostatic attraction acts between the movable comb-shaped teeth 12b and the fixed comb-shaped teeth 16b, and electrostatic attraction also acts between the movable comb-shaped teeth 13b and the fixed comb-shaped teeth 17b. By the electrostatic attraction, the movable comb-shaped teeth 12b are drawn downwardly toward the fixed comb-shaped teeth 16b, and the movable comb-shaped teeth 13b are drawn upwardly toward the fixed comb-shaped teeth 17b. That is, a force moving downwardly the mirror 1 acts on the mirror 1 on the movable comb-shaped teeth 12b side, while a force moving upwardly the mirror 1 acts on the mirror 1 on the movable comb-shaped teeth 13b side.

Since the gimbal part 5 (i.e., the mirror 1) is pivotally supported by the torsion bars 14a and 14b, the tilting movement of the mirror 1 caused by the electronic attraction results in rotation movement of the mirror 1. That is, the mirror 1 tilts in the direction of inverse rotation about the rotation axis $O_X$ in the Y-Z plane.

In the example shown in FIG. 4A, both of the electrostatic attraction moving the mirror 1 upwardly on comb-shaped teeth 2a side and the electrostatic attraction moving the mirror 1 downwardly on the comb-shaped teeth 3a side contribute to the rotation of the mirror 1 in the direction of inverse rotation in the X-Z plane. In the example shown in FIG. 4B, both of the electrostatic attraction moving the mirror 1 downwardly on the comb-shaped teeth 2b side and the electrostatic attraction moving the mirror 1 upwardly on the comb-shaped teeth 3b side contribute to the rotation of the mirror 1 in the direction of normal rotation in the X-Z plane.

In the regions $R_3$ and $R'_3$, both of the electrostatic attraction moving the mirror 1 upwardly on the comb-shaped teeth 12a side and the electrostatic attraction moving the mirror 1 downwardly on the comb-shaped teeth 13a side contribute to the rotation of the mirror 1 in the direction of normal rotation in the Y-Z plane. In the regions $R_4$ and $R'_4$, both of the electrostatic attraction moving the mirror 1 downwardly on the comb-shaped teeth 12b side and the electrostatic attraction moving the mirror 1 upwardly on the comb-shaped teeth 13b side contribute to the rotation of the mirror 1 in the direction of inverse rotation in the Y-Z plane.

As described above, by selectively applying voltages to the comb-shaped teeth, the mirror 1 tilts in the X-Z plane or in the Y-Z plane. That is, the mirror 1 is able to tilt about two rotation axes. Therefore, according to the above mentioned configuration of the micromirror 100, scanning about two rotation axes can be achieved.

On the both sides of the mirror 1, forces act on the mirror 1 to rotate the mirror 1 in the same rotational direction in the X-Z plane or in the Y-Z plane. Therefore, it is possible to rotate the mirror 1 by a sufficiently strong driving force. By securing a sufficiently strong driving force, it is possible to enhance the stability and the response speed of rotation movement of the mirror 1. When the electrostatic attraction is caused between the movable comb-shaped teeth and the fixed comb-shaped teeth, forces having symmetric vectors (i.e., vectors having the same scalar quantity and directions opposed to each other) act at positions which are symmetric with respect to the rotation axis $O_X$ on the mirror 1.

Therefore, an unbalanced load is not applied to the structural components, particularly to the torsion bars 4a and 4b of the micromirror 100. Strength of forces acting on the micromirror 100 to deform the structural components in unintended directions can be decreased. As a result, the durability of the micromirror 100 can be enhanced. Loss of energy is also decreased. Accordingly, the electrostatic attraction is effectively converted to the rotation movement of the mirror 1. Such a configuration of the micromirror 100 also makes it possible to lower a driving voltage of the mirror and to reduce power consumption.

As described above, the micromirror 100 is configured such that the mirror 1 can be rotated with respect the normal position, defined when no voltage is applied to the micromirror 100, both in the directions of normal rotation and inverse rotation in the X-Z plane or in the Y-Z plane. Such a configuration of the micromirror 100 makes it possible to secure a relatively large tilting angle, and to make tilting angles in the normal rotation and the inverse rotation identical with each other (i.e., to provide a symmetric property for tilting movement of the mirror 1).

The micromirror 100 according to the embodiment is also able to provide easiness of design of an optical system in a device in which the micromirror 100 is to be mounted. Since the micromirror 100 has a symmetric property in tilting movement with respect to the normal position of the mirror 1, it is also possible to design an optical system to provide a symmetric property for a scanning range of a beam to be deflected by the mirror 1.

Although the present invention has been described in considerable detail with reference to certain preferred embodiments thereof, other embodiments are possible.

For example, it is understood that the number of comb-shaped teeth provided in the micromirror may be changed.

This application claims priority of Japanese Patent Application No. P2006-001331, filed on Jan. 6, 2006. The entire subject matter of the applications is incorporated herein by reference.

What is claimed is:

1. A micromirror, comprising:
   a reflection mirror;
   a first pair of torsion bars formed to protrude from the reflection mirror;
   a first supporting frame that supports the reflection mirror such that the reflection mirror is torsionally rotatable about a first rotation axis via the first pair of torsion bars;
   a second pair of torsion bars formed to protrude from the first supporting frame in a direction substantially perpendicular to a direction in which the first pair of torsion bars are extended; and
   a second supporting frame that supports the first supporting frame such that the first supporting frame is torsionally rotatable about a second rotation axis substantially perpendicular to the first rotation axis via the second pair of torsion bars;
   wherein each of the second pair of torsion bars includes two separate conductive members.

2. The micromirror according to claim 1, further comprising:
a first pair of electrodes respectively formed on the reflection surface and the first supporting frame so that the reflection mirror torsionally rotates about the first rotation axis in a direction of normal rotation when electronic attraction acts between the first pair of electrodes;
a second pair of electrodes respectively formed on the reflection surface and the first supporting frame so that the reflection mirror torsionally rotates about the first rotation axis in a direction of inverse rotation when electronic attraction acts between the second pair of electrodes;
a third pair of electrodes respectively formed on the first supporting frame and the second supporting frame so that the reflection mirror torsionally rotates about the second rotation axis in a direction of normal rotation when electronic attraction acts between the third pair of electrodes; and
a fourth pair of electrodes respectively formed on the first supporting frame and the second supporting frame so that the reflection mirror torsionally rotates about the second rotation axis in a direction of inverse rotation when electronic attraction acts between the fourth pair of electrodes.

3. The micromirror according to claim 1, wherein:
each of the second pair of torsion bars includes a laminated structure of three layers including two conductive layers and an insulating layer sandwiched between the two conductive layers; and
the two conductive layers of each of the second pair of torsion bars respectively function as the two separate conductive members.

4. A micromirror device, comprising:
a micromirror according to claim 1; and
a driving voltage supply unit that supplies a voltage to the micromirror,
wherein the micromirror includes:
a first pair of electrodes respectively formed on the reflection surface and the first supporting frame so that the reflection mirror torsionally rotates about the first rotation axis in a direction of normal rotation when electronic attraction acts between the first pair of electrodes; and
a second pair of electrodes respectively formed on the reflection surface and the first supporting frame so that the reflection mirror torsionally rotates about the first rotation axis in a direction of inverse rotation when electronic attraction acts between the second pair of electrodes,
wherein the driving voltage supply unit is connected to the first pair of electrodes via two of the separate conductive members of the second pair of torsion bars so that a voltage is applied between the first pair of electrodes,
wherein the driving voltage supply unit is connected to the second pair of electrodes via two of the separate conductive members of the second pair of torsion bars so that a voltage is applied between the second pair of electrodes.

5. The micromirror device according to claim 4, wherein:
each of the second pair of torsion bars includes a laminated structure of three layers including two conductive layers and an insulating layer sandwiched between the two conductive layers; and
the two conductive layers of each of the second pair of torsion bars respectively function as the two separate conductive members.

6. A micromirror, comprising:
a reflection mirror;
a movable electrode group including electrodes formed to protrude from the reflection mirror;
a first pair of torsion bars formed to protrude from the reflection mirror in a direction which is different from a direction in which the movable electrode group is formed;
a first supporting frame that supports the reflection mirror such that the reflection mirror is torsionally rotatable about a first rotation axis via the first pair of torsion bars;
a fixed electrode group including electrodes which are formed to protrude from the first supporting frame and are positioned adjacently to the movable electrode group;
a second pair of torsion bars formed to protrude from the first supporting frame in a direction substantially perpendicular to a direction in which the first pair of torsion bars are extended; and
a second supporting frame that supports the first supporting frame such that the first supporting frame is torsionally rotatable about a second rotation axis substantially perpendicular to the first rotation axis via the second pair of torsion bars;
wherein each of the second pair of torsion bars includes two separate conductive members,
wherein the movable electrode group and the fixed electrode group are electrically connectable to an external device via two of the separate conductive members of the second pair of torsion bars so that the mirror tilts in a direction of normal rotation when a voltage is applied by the external device between the movable electrode group and the fixed electrode group,
wherein the movable electrode group and the fixed electrode group are electrically connectable to the external device via the other two of the separate conductive members of the second pair of torsion bars so that the mirror tilts in a direction of inverse rotation when a voltage is applied by the external device between the movable electrode group and the fixed electrode group.

* * * * *